United States Patent [19]

Herberg

[11] Patent Number: 4,500,902
[45] Date of Patent: Feb. 19, 1985

[54] FET CONTROLLED THYRISTOR

[75] Inventor: Helmut Herberg, Munich, Fed. Rep. of Germany

[73] Assignee: Siemens Aktiengesellschaft, Berlin & Munich, Fed. Rep. of Germany

[21] Appl. No.: 345,594

[22] Filed: Feb. 4, 1982

[30] Foreign Application Priority Data

Mar. 31, 1981 [DE]  Fed. Rep. of Germany ....... 3112942

[51] Int. Cl.³ .................... H01L 29/74; H01L 29/78; H01L 27/02; H01L 29/167
[52] U.S. Cl. ........................................ 357/38; 357/23; 357/43; 357/64; 357/86
[58] Field of Search ...................... 357/38, 43, 20, 86, 357/23.4, 64

[56] References Cited

U.S. PATENT DOCUMENTS

| 3,300,694 | 1/1967 | Stehney et al. | 357/38 |
| 3,486,088 | 12/1969 | Gray et al. | 357/38 |
| 3,641,404 | 2/1972 | Svedberg | 357/38 |
| 4,060,825 | 11/1977 | Schlegel | 357/20 |
| 4,165,517 | 8/1979 | Temple et al. | 357/38 |
| 4,224,634 | 9/1980 | Svedberg | 357/38 |

FOREIGN PATENT DOCUMENTS

| 2438894 | 2/1976 | Fed. Rep. of Germany. | |
| 8008 | 2/1980 | Fed. Rep. of Germany | 357/38 T |
| 52-35586 | 3/1977 | Japan | 357/38 T |
| 55-113371 | 9/1980 | Japan | 357/20 |

OTHER PUBLICATIONS

Porst A., "Halbleiter", Siemens AG, pp. 204-209.

Primary Examiner—Andrew J. James
Assistant Examiner—John LaMont
Attorney, Agent, or Firm—Hill, Van Santen, Steadman & Simpson

[57] ABSTRACT

A thyristor has a semiconductor body with an n-emitter provided with a cathode, a p-emitter provided with an anode, and two base layers respectively adjacent thereto. Mutually contridictory requirements for great stability against unintentional ignition operations and a high degree of trigger insensitivity are met as well as possible. To this end, a connectible n(p) emitter is provided laterally adjacent the n(p) emitter, the connectible n(p) emitter forming a three layer structure together with the two base layers with a higher current transfer ratio for the charge carriers emitted thereby than the n(p) emitter. For the purpose of producing a high degree of ignition insensitivity, the connectible n(p) emitter can be selectively connected to the n(p) emitter via a semiconductor switch. The area of use encompasses ignition-sensitive thyristors having a high dU/dt load requirement.

18 Claims, 5 Drawing Figures

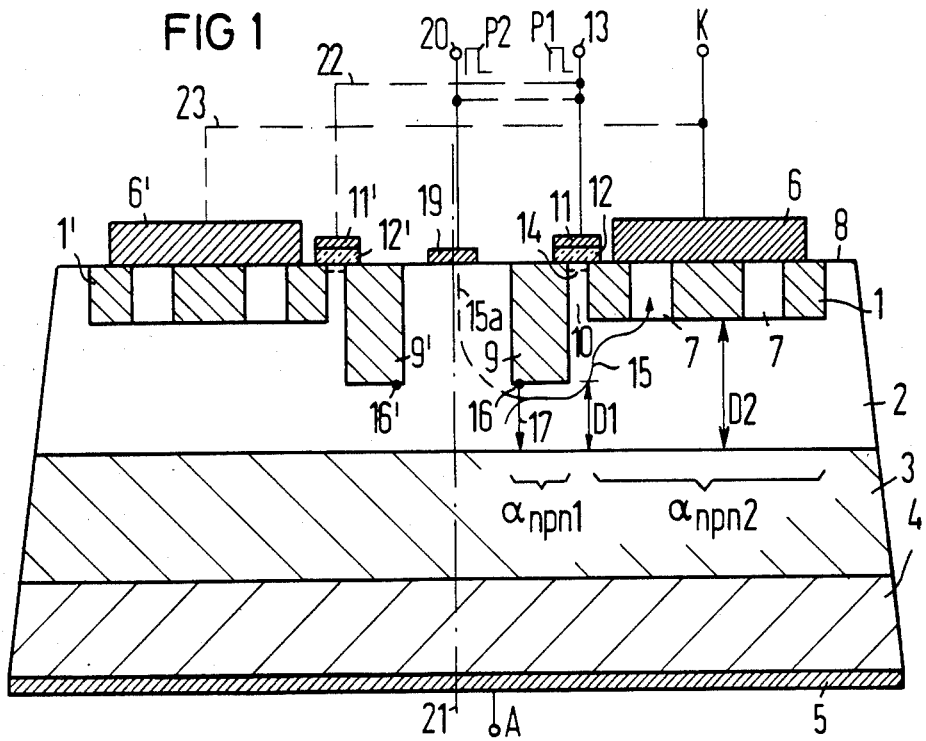
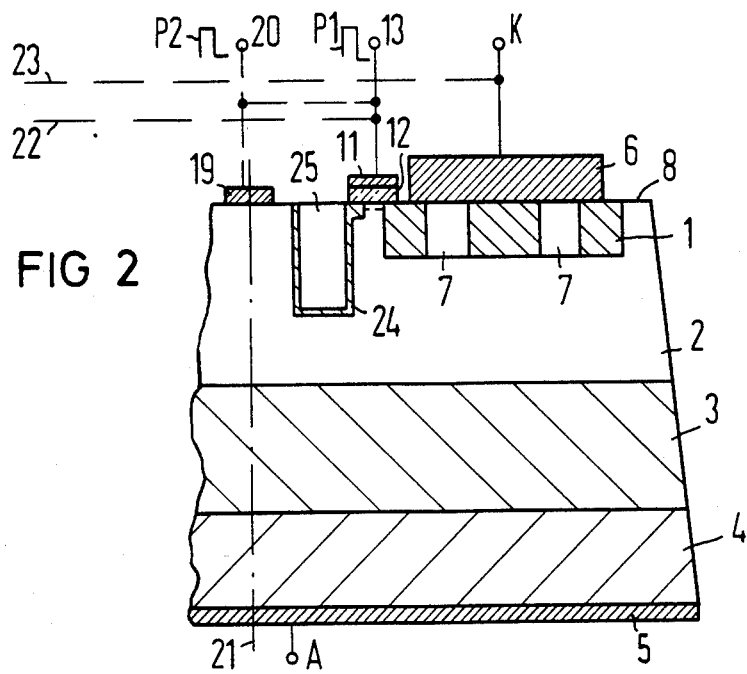

FET CONTROLLED THYRISTOR

CROSS REFERENCE TO RELATED APPLICATION

This application is related to my co-pending application Ser. No. 345,925, filed Feb. 4, 1982.

BACKGROUND OF THE INVENTION

1. Field of the Invention

The present invention relates to a thyristor having a semiconductor body which contains an n-emitter contacted by a cathode, a p-emitter contacted by an anode and a pair of base layers respectively adjacent to the emitters, and to a method for the operation of such a thyristor.

2. Description of the Prior Art

A thyristor of the type generally set forth above is known from the German allowed and published application No. 2,438,894 in which the n-emitter is penetrated by a plurality of projections of the adjacent base layer, the projections extending up to the boundary surface of the semiconductor body and being conductively connected to the cathode. These projections are also designated as fixed emitter short circuits. By means of a plurality of such emitter short circuits, a good stability of the thyristor is achieved i.e. a high degree of security against unintentional trigger operations given the occurrence of voltages at the anode-cathode path poled in the forward conducting direction, such voltages partially arising very quickly (high dU/dt load). On the other hand, the trigger sensitivity of the thyristor is reduced because of the fixed emitter short circuits.

A thyristor of the type generally set forth above is disclosed in the German patent application No. P 29 45 366.5, in which controllable emitter short circuits are provided in the form of gate-controlled field effect transistor (FET) structures at the boundary surface of the semiconductor body which carries the cathode (anode). Given switched-on, i.e. effective, emitter short circuits, a high stability is achieved, on the one hand, whereas, on the other hand, the trigger sensitivity of the thyristor is brought approximately to a value which would be present without the controllable emitter short circuits by turning off the emitter short circuits.

SUMMARY OF THE INVENTION

The object of the present invention is to provide a thyristor of the type generally mentioned above in which the mutually contradictory requirements for high stability and great trigger sensitivity are even better met than in thyristors heretofore known.

According to the invention, this is achieved, in a thyristor of the type set forth above, in that a connectible n(p) emitter is provided laterally next to the n(p) emitter, the connectible emitter being conductively connectible to the n(p) emitter via a semiconductor switch, and in that the connectible n(p) emitter forms a three layer structure of alternating conductivity type together with the two base layers whose current transfer ratio for the charge carriers emitted from the connectible n(p) emitter given positive bias voltage of the anode in comparison to the cathode is greater than the corresponding current transfer ratio of the three layer structure which is formed by the n(p) emitter and the two base layers.

The advantage attainable in practicing the present invention is that the connectible n(p) emitter, on the one hand, does not reduce the stability of the thyristor in the non-conductive state of the semiconductor switch because of the connection to the n(p) emitter which is then lacking and, therefore, to the cathode (anode), whereas, on the other hand, it increases the trigger sensitivity of the thyristor to a very significant degree in the conductive state of the semiconductor switch. In particular, the trigger sensitivity increases to that degree to which the current transfer ratio of the three layer structure comprising the connectible n(p) emitter and the two base layers for the charge carriers emitted by the connectible n(p) emitter is greater than the corresponding current transfer ratio of the three layer structure comprising the n(p) emitter and the two base layers.

In accordance with the method of operation, for triggering of the thyristor, the semiconductor switch is switched on. More specifically, a positive (negative) voltage pulse is respectively supplied to the control voltage terminal of the semiconductor switch, given design of the switch as an n(p) channel field effect transistor of the enhancement type and, under certain conditions, to the control voltage terminal of the controllable short circuit, given design of the same as an n(p) channel field effect transistor structure of the depletion type.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a cross-sectional view through a first exemplary embodiment of the invention; FIG. 2 is a fragmentary cross-sectional view through a second exemplary embodiment of the invention;

DESCRIPTION OF THE PREFERRED EMBODIMENTS

Figure 3:
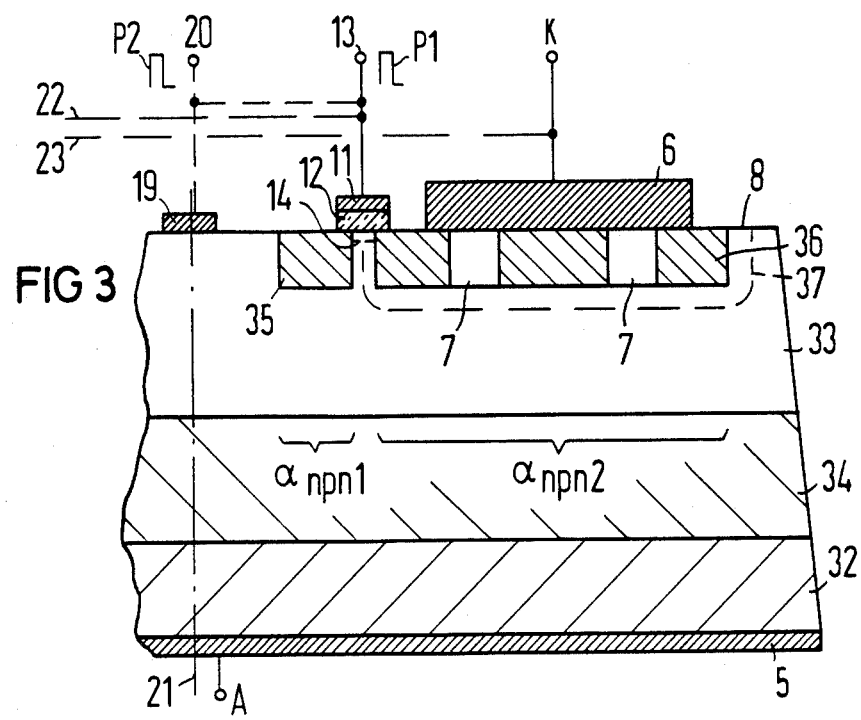
FIG. 3 is a fragmentary cross-sectional view through a third exemplary embodiment of the invention.

A thyristor is illustrated in FIG. 1 which exhibits a semiconductor body comprising doped semiconductor material, for example, silicon, which has four layers of alternating conductivity type. An n-conductive layer 1 is designated as an n-emitter, a p-conductive layer 2 is designated as a p-base, an n-conductive layer 3 is designated as an n-base and a p-conductive layer 4 is designated as a p-emitter. The p-emitter 4 is provided with an anode 5 which has a terminal A, whereas the n-emitter 1 exhibits a cathode 6 with a terminal K.

The n-emitter 1 is penetrated by a plurality of projections 7 of the p-base 2, the projections extending up to the boundary surface 8 of the semiconductor body and being conductively connected to the cathode 6 in the semiconductor body. The projections 7 represent so-called fixed emitter short circits which prevent an unintentional triggering of the thyristor upon application of a blocking voltage to the terminals A and K which places the anode 5 at a more positive potential than the cathode 6. This is explained by the fact that the hole electrons transported under the influence of the blocking voltage in the direction of the n-emitter 1 do not, for their majority, arrive at the pn junction between the parts 1 and 2 but, rather, arrive directly at the cathode 6 via the projection 7, so that they do not trigger an emission of electrons from the n-emitter 1. Given an increasing plurality of fixed emitter short circuits 7, the thyristor is also trigger-insensitive, i.e. stable, with respect to larger or quickly-rising blocking voltages at the terminals A, K.

Proceeding from the boundary surface 8, an n-conductive region 9 extends significantly deeper into the p-base 2 than the n-emitter 1 and is generated in the layer 2 by a diffusion or an implantation of donors. The region 9 is provided laterally next to the n-emitter 1, whereby there is a distance to the n-emitter 1 which is determined by the width of a region 10 of the p-base 2. The region 10 is covered by a metallic gate 11 or a gate 11 consisting of polysilicon which is separated from the boundary surface 8 by a thin, electrically insulating layer 12 comprising, for example, $SiO_2$. The gate 11 is connected to a control voltage terminal 13. The mutually-facing edge areas of the n-emitter 1 and of the region 9, together with the region 10, the insulating layer 12 and the gas 11 form a field effect transistor of the enhancement type. Given application of a control voltage to the terminal 13, which is positive relative to the cathode K, and exceeds the value of the threshold voltage, an inversion channel is formed at the boundary surface 8 below the gate 11, the inversion channel being indicated at 14. This n-conductive channel represents a low-resistance connection between the region 9 and the n-emitter 1 or, respectively, the cathode 6. When the control voltage is disconnected from the terminal 13, then the channel 14 is eliminated and the connection between the region 9 and the n-emitter 1 is interrupted. The structure formed by the elements 1, 9, 10, 11 and 12 thus represents a semiconductor switch which connects the region 9 to the cathode 6 in a low-resistance manner in its first switching state, so that an increased n-emitter 1, 9 arises, whereas, in its second switching state, it disconnects the region 9 from the cathode 6 so that the region 9 cannot exert any emitter function. In the following, the region 9 is designated as a connectible n-emitter.

Proceeding from the boundary surface 8, the penetration depth of the connectible n-emitter 9 into the p-base 2, given the exemplary embodiment illustrated in FIG. 1, is more than twice the penetration depth of the n-emitter 1. If one assumes the penetration depth of approximately 20 $\mu m$ for the n-emitter 1, then the penetration depth of the n-emitter 9 amounts, for example, to 50 $\mu m$. Accordingly, the distance D1 of the connectible n-emitter 9 from the pn junction between the base layers 2 and 3 is smaller than the distance D2 of the n-emitter 1 from that junction.

In the following, the triggering of the thyristor according to FIG. 1 is set forth. One proceeds from the fact that a voltage poling the thyristor in the forward-conducting direction is applied to the terminals A and K and that a positive control voltage is supplied to the terminal 13. Under the influence of the former voltage, thermally-generated hole electrons, for example, move along the path 15 indicated in FIG. 1 in the direction toward a fixed emitter short circuit 7, so that, given a conductive channel 14, a voltage drop arises at a point 16 which biases the pn junction between the connected n-emitter 9 and the p-base 2 in the forward conducting direction to such a degree that electrons are emitted into the p-base 2 at this location. The electrons emitted by the n-emitter 9 move in the direction of an arrow 17, whereby a portion of such electrons reach a boundary surface between the n-base 3 and the p-emitter 4 and cause an emission of hole carriers from the p-emitter. These emission operations mutually promote one another until the layers 2 and 3 are flooded by emitted charge carriers, i.e. the thyristor has triggered in the area of the connectible n-emitter 9. Proceeding from the n-emitter 9, the triggered surface of the thyristor gradually spreads in the lateral direction to the entire area of the n-emitter 1. This spreading, which is attributed, among other things, to a lateral diffusion of charge carriers from the previously-triggered cross-sectional portion, occurs, for example, with a propagation rate of 10–100 $\mu m/\mu s$. As soon as the triggered portion of the thyristor cross-section at least partially covers the area of the n-emitter 1, the control voltage can again be disconnected from the terminal 13. Therefore, a pulse-shaped control voltage P1 is advantageously employed.

In the case where a trigger electrode 19 is disposed on the p-base 2, the ignition of the thyristor occurs given smaller voltages between the terminals A and K than were assumed in the above observations by means of an ignition current pulse P2 which is supplied by way of an ignition circuit connected at a terminal 20. Thereby, the bias voltage at the circuit point 16 is generated by whole carriers which derive from the semiconductor region below the ignition electrode 19 and arrive via the paths 15a and 15 indicated in FIG. 1 to a fixed short circuit 7. Thereby, the terminal 13 is connected simultaneously with the control voltage P1. Advantageously, the terminals 20 and 13 are connected to one another, whereby the ignition current pulse P2 allows the voltage pulse P1 to drop off at the terminal 13.

The thyristor is quenched when the load current falls below a so-called holding current. This occurs, for example, when the voltage is disconnected from the terminals A and K or, if it is a matter of alternating voltage, upon occurrence of the next successive zero crossing.

The high trigger sensitivity of the thyristor according to FIG. 1 derives from the small distance D1 between the connectible n-emitter 9 and the boundary surface between the layers 2 and 3. The current transfer ratio $\alpha_{npn1}$ of the npn structure formed of the elements 9, 2 and 3, this relating to the electrons emitted by the n-emitter 9, is significantly greater than the corresponding current transfer ratio $\alpha_{npn2}$ for the npn structure formed of the elements 1, 2 and 3. This is explained by the fact that the recombination rate of the electrons emitted by the n-emitter 1 is significantly greater because of the greater distance D2 of the n-emitter 1 from the boundary surfaces between the bases 2 and 3 than is the recombination rate of the electrons emitted by the n-emitter 9. The trigger sensitivity of the thyristor according to FIG. 1 is therefore greater than the trigger sensitivity of a traditional thyristor by the degree to which the current transfer ratio $\alpha_{npn1}$ is greater than $\alpha_{npn2}$.

When the p-base 2 exhibits a doping profile in which the doping degree is smaller in the region of the lower boundary surface of the connectible n-emitter 9 than at the lower boundary surface of the n-emitter 1, than the bias voltage of the pn junction between the semiconductor elements 2 and 9 prevailing at the point 16 is further increased in comparison to the case in which the degree of doping of the p-base does not exhibit such a reduction, so that the trigger sensitivity further increases in the area of the connectible n-emitter 9.

For reasons of greater clarity, the principle of the invention has been explained up to this point on the basis of that portion of the illustrated thyristor which lies to the right of the vertical center line 21. If, in FIG. 1, one now proceeds from a rotational-symmetrical structure of the thyristor with the line 21 as the axis of symmetry, then annular designs of the elements 1, 6, 9, 11 and 12 occur. The cross-sectional area of these circuit components which lie to the left of the line 21 are referenced in FIG. 1 with 1', 6', 9', 11' and 12'. The ignition of such structure occurs along a circle containing the points 16 and 16' which is concentric about the axis 21.

On the other hand, the line 21 in FIG. 1 can be interpreted as being a plane of symmetry which is perpendicular to the plane of the drawing. Thereby, the elements 1, 6, 9, 11 and 12 advantageously exhibit an elongate form and proceed with their larger dimensions perpendicular to the plane of the drawing, namely, preferably over the entire thyristor cross-section. The elements 1', 6', 9', 11' and 12' then represent analogous sub-structures at the other side of the plane of symmetry which lies symmetrically with respect to the elements 1, 6, 9, 11 and 12 with reference to the latter. In this case, the gates 11 and 11' are connected to one another for the purpose of a common drive, this being indicated by means of a broken line 22, and they can be further connected to a common terminal 20. The cathode 6' is connected to the cathode 6, this also being indicated by means of a broken line 23.

The elements 1, 6, 9, 11 and 12 can also be designed strip-shaped and be disposed at the boundary surface 8 of the thyristor in the form of a spiral or in some other curved form.

Given the exemplary embodiment illustrated in FIG. 2, a connectible n-emitter 24 is provided which takes the place of the connectible n-emitter 9 of FIG. 1 and exhibits the same external dimensions in comparison to the p-base 2 as the n-emitter 9. A trench-like recess 25 of the base 2 is provided as the edge zones, whereby, proceeding from the edge of the base 2, the recess 25 extends only a few $\mu$m, for example, 5 $\mu$m, into the p-base 2. Thereby, the n-conductive region 24 is generated by diffusion or by the implantation of donors, whereas the recess 25 is preferably produced by etching. The remaining circuit elements of FIG. 2 correspond to the circuit elements of FIG. 1 and have been provided with the same reference characters.

A thyristor having a p-emitter 32, an n-base 34 and a p-base 33 is illustrated in FIG. 3. In FIG. 3, a connectible n-emitter 35 takes the place of the connectible n-emitter 9 of FIG. 1 and exhibits the same lateral dimensions in comparison to the p-base 33 as does the element 9 in comparison to the p-base 2. An n-emitter 36 is provided into the place of the n-emitter 1 of FIG. 1 and exhibits the same lateral dimensions as the n-emitter 1. The vertical dimensions of the elements 35 and 36 are attached to one another, whereby they are advantageously greater than the vertical dimensions of the n-emitter 1 and, for example, correspond to those of the elements 9 and 9' of FIG. 1. The remaining circuit components of FIG. 3 correspond to circuit component of FIG. 1 and have been provided with the same reference characters.

The n-emitter 36 is surrounded by a sub-region 37 of the p-base 33 which exhibits an additional p-doping so that its doping degree is higher than that of the remaining subregions of the p-base 33. This results in the fact that the three layer structure of the elements 36, 33 and 34 exhibits a current transfer ratio $\alpha_{npn2}$ relative to the electrons emitted by the n-emitter 36 when a voltage is applied at the terminals A and K in the forward-conducting direction of the thyristor which is smaller than the corresponding current transfer ratio $\alpha_{npn1}$ of the three layer structure 35, 33 and 34 relative to the electrons emitted from the region 35. The current transfer ratios $\alpha_{npn1}$ and $\alpha_{npn2}$ deviate all the more greatly from one another the more greatly the doping degree of the sub-region 37 differs from the remaining subregions of the p-base 33. When a control voltage, for example, voltage P1, is supplied to the terminal 13 which causes the regions 35 and 36 to be connected in a low-resistance manner to one another via the inversion channel 14, then the thyristor becomes very trigger-sensitive in the region of the connectible n-emitter 35. When the control voltage is disconnected from the terminal 13, the connectible n-emitter 35 is inoperative, so that the thyristor exhibits great stability because of the fixed emitter short circuits 7 and the high doping of the subregion 37. Given an impurity concentration in the p-base 33 of approximately $5 \times 10^{16}$ cm$^{-3}$, an impurity concentration of approximately $2 \times 10^{17}$ cm$^{-3}$ comes into consideration for the sub-region 37, whereby these numerical indications only serve for explaining the doping difference in a not to be interpreted as limiting values.

Different current transfer ratios $\alpha_{npn1}$ and $\alpha_{npn2}$ can also be achieved in such a manner that the subregion 37 is not more strongly doped than the remaining portions of the p-emitter 33 but, rather, is provided with additional recombination centers instead. This occurs, for example, by irradiation of the p-base 33 which is limited to the sub-region 37 before the n-emitter 36 is generated with an electron beam. On the other hand, recombination centers can also be introduced into the sub-region 37 in the form of gold or platinum atoms by diffusion or implantation. The increase of the plurality of recombination centers in the sub-region 37 effects a reduction of the current transfer ratio $\alpha_{npn2}$ in comparison to the current transfer ratio $\alpha_{npn1}$.

The thyristors according to FIGS. 2 and 3 are operated in the same manner as the thyristor according to FIG. 1.

Figure 4:
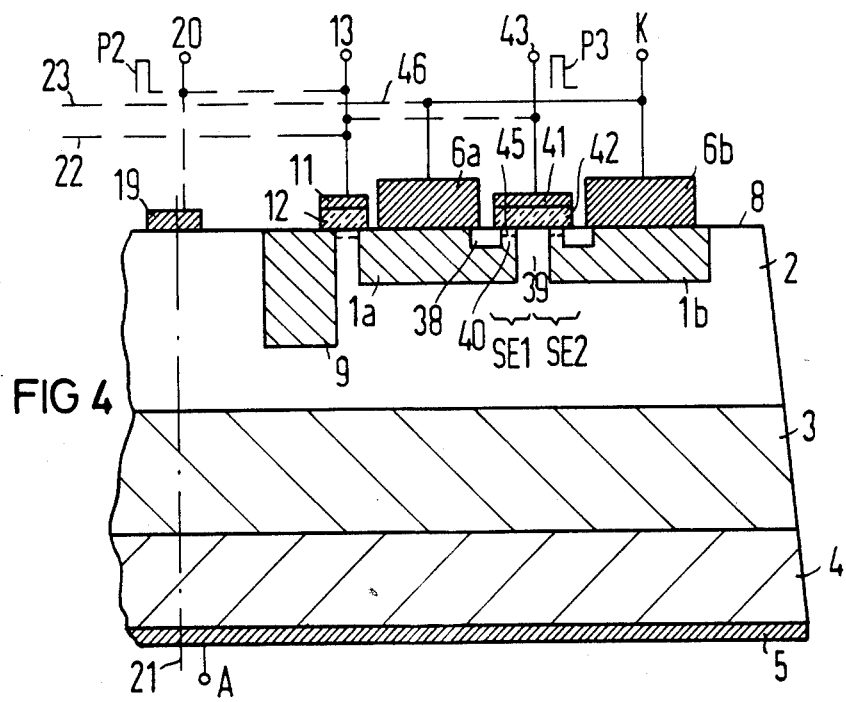
FIG. 4 is a fragmentary cross-sectional view through a fourth exemplary embodiment of the invention.

The exemplary embodiment of FIG. 4 differs from that of FIG. 1 in that controllable emitter short circuits are provided instead of the fixed short circuits 7. The n-emitter of FIG. 1 is sub-divided into two or more emitter sub-regions 1a, 1b of which each is provided with a portion 6a or, respectively, 6b, of the cathode. The elements 6a and 6b are connected to one another and are connected to a common terminal K.

A controllable emitter short circuit SE1 of FIG. 4 comprises a p-conductive semiconductor region 38 inserted into the emitter sub-region 1a and which extends up to the boundary surface 8 of the semiconductor body and is contacted by the element 6a of the cathode at the boundary surface 8. The emitter sub-regions 1a and 1b are separated from one another by a region 39 of the p-base 2 which is to be interpreted as being a second p-conductive semiconductor region of the controllable emitter short circuit. An edge region 40 of the emitter sub-region 1a which is n-conductive and extends from the boundary surface 8 lies between the regions 38 and 39. The emitter sub-region 1a is covered by a gate 41 which has a terminal 43 and is separated from the semiconductor body by a thin, electrically insulating layer 42 comprising, for example, SiO$_2$. The elements 38–43 form a FET structure of the depletion type given which a p-conductive channel 45 exists in the edge region 40 without the application of a control voltage to the terminal 43, the p-conductive channel 45 connecting the region 39 to the region 38 in a low-resistance manner and, therefore, connecting the p-base 2 to the portion 6a of the cathode in a low-resistance manner. The channel 45 is either an inversion channel or a doped channel generated by a p-doping at the boundary service 8. Therefore, the emitter short circuit SE1 is actively connected given a voltage-free terminal 43. When a positive control voltage is applied to the terminal 43, then the channel 45 is eliminated and the low-resistance connection of the elements 2 and 6a is interrupted, i.e. the emitter short circuit SE1 is switched inoperative.

In FIG. 4, a further controllable short circuit SE2 is provided at the edge side relative to the emitter sub-region 1b, the emitter short circuit SE2 being constructed in accordance with the emitter short circuit SE1. Thereby, the gate 41 is assigned in common to the emitter short circuits SE1 and SE2. Advantageously, a line 46 is provided which connects the terminals 43 and 13 to one another. The terminals 13 and 43 can also be individually or mutually connected to the terminal 20. The remaining circuit elements of FIG. 4 correspond to the elements of FIG. 1 and are provided with the same reference characters.

Instead of the two illustrated emitter sub-regions 1a and 1b, a plurality of correspondingly-designed emitter sub-regions or only a single such sub-region, for example, 1a or 1b, can be provided given the exemplary embodiment of FIG. 4.

A particularly high stability is achieved with the exemplary embodiment of FIG. 4, namely, in particular, when a larger plurality of emitter sub-regions 1a, 1b . . . etc and a correspondingly large plurality of controllable emitter short circuits SE1, SE2 . . . etc. are provided. These are switched off by a positive control voltage, for example, a pulse-shaped control voltage P3, applied to the terminal 43 at the ignition time, so that the propagation of the triggered front over the entire thyristor cross-section is not impeded by the emitter short circuits. When the thyristor cross-section has become current-conducting in the area of the emitter sub-regions 1a, 1b, the control voltage can be switched off, as indicated by the pulse P3. When a terminal 20 is provided to which an ignition current pulse P2 is supplied, then, given a connection of the terminals 43 and 20, the control voltage P3 automatically drops off at the latter. The control of the terminal 13 occurs in the manner set forth with respect to FIG. 1.

The FET structures, for example, 38–45, of the depletion type described up to this point can also be replaced by FET structure of the enhancement type when an additional, negative control voltage which allows inversion channels, for example, 45, to arise is supplied to their gate terminals, for example, 43. At the ignition time, the control voltage P3 is then superimposed on the additional control voltage in order to eliminate the channels.

Figure 5:
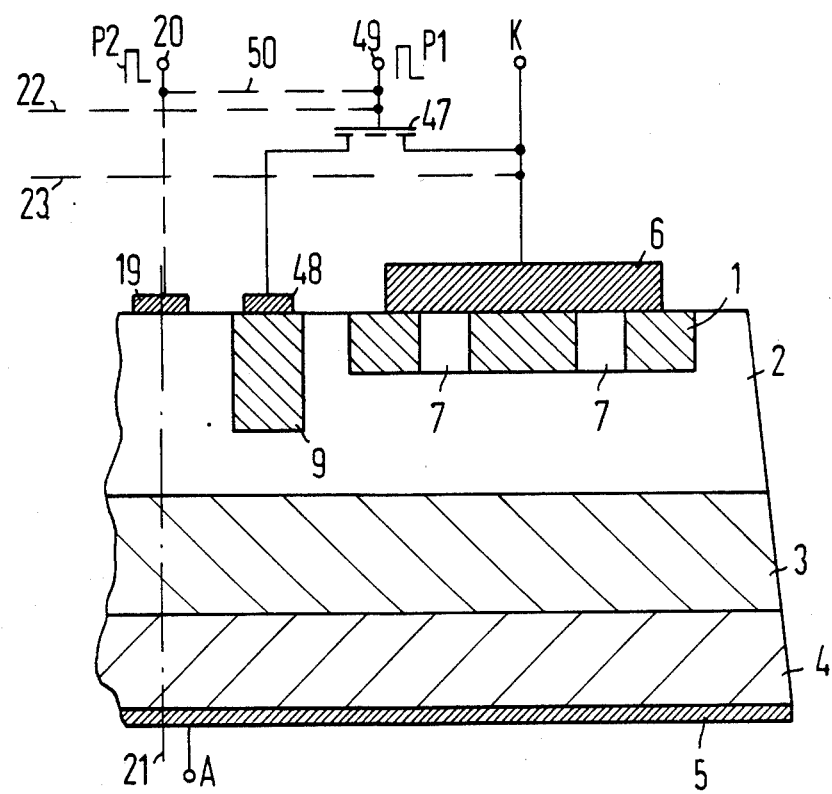
FIG. 5 is a schematic representation of an alternative embodiment of the invention with respect to that of FIG. 1.

FIG. 5 illustrates another execution of the exemplary embodiment according to FIG. 1 in which the connectible n-emitter 9 is conductively connected to the n-emitter 1 via a semiconductor switch in the form of an external field effect transistor 47. The source-drain path of the field effect transistor 47 is connected, on the one hand, to the cathode 6 and, on the other hand, to a conductive coating 48 which contacts the connectible n-emitter 9. The gate of the field effect transistor 47 is provided with a control voltage terminal 49 which can be connected to the terminal 20 via a line 50. The operation of the thyristor according to FIG. 5 occurs in the manner described on the basis of FIG. 1, whereby the terminal 49 corresponds to the terminal 13 and has the control voltage P1 applied thereto, whereas an ignition current pulse P2 is supplied, if necessary, to the terminal 20.

Within the framework of the invention, the connectible auxiliary emitter can also be p-conductive, can be laterally disposed next to the p-emitter in the n-base of the thyristor and, for producing a high degree of trigger insensitivity, can be connected in a low resistance manner via a semiconductor switch to the p-emitter. In this case, the fixed or controllable short circuits are also provided in the area of the p-emitter. All figures can be employed for the illustration of this circuit alternative when the designations of the terminals A and K are interchanged, the semiconductor portions receive conductivity types which are respectively opposite to those previously described, and the control voltages as well as the control current are supplied with opposite polarity.

All exemplary embodiments according to FIGS. 2–5, in accordance with FIG. 1, can be respectively designed centrally symmetrical with respect to an axis of symmetry 21 or can be symmetrically constructed relative to a plane which is perpendicular to the plane of the drawing and is indicated by the line 21. In the latter case, the lines 22 and 23 serve for the connection of homogeneous elements which are symmetrical with respect to the line 21.

The elements 1, 6, 11, 12, 24 and 25 illustrated in FIG. 2 can also be designed strip-like and be disposed at the boundary surface 8 of the thyristor in the form of a spiral or in some other curved shape. The same also applies to the elements 6, 11, 12, 35, 36 and 37 of FIG. 3, 1a, 1b, 6a, 6b, 9, 11, 12 and 38–42 of FIG. 4 and 1, 6, 9 and 48 of FIG. 5.

The exemplary embodiments according to FIGS. 2, 3 and 4 can also be equipped with a semiconductor switch in the form of an external transistor 47. Further, the connectible n-emitters 9 and 35 of FIGS. 3–5 can be designed in accordance with the elements 24 and 25 of FIG. 2 and the fixed emitter short circuits 7 in all appertaining embodiments can be replaced by controllable emitter short circuits, for example, the emitter short circuits SE1 and SE2 of FIG. 4.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a thyristor of the type having a semiconductor body in which a first base of a first conductivity type has a first emitter of a second conductivity type on one side thereof and a second base of the second conductivity type on the other side thereof, and in which a second emitter of the first conductivity type is provided adjacent the second base on the side opposite the first base, the improvement therein comprising:

a third emitter of the second conductivity type adjacent and spaced from the first emitter; and a semiconductor switch bridging and operable to conductively connect said third and first emitters, said semiconductor switch comprising a field effect transistor including a first edge region of said third emitter, a second edge region of the first emitter, a third region of the first base between the first and third emitters, a gate spanning said third region and said first and second edge regions and insulated from the semiconductor body, and a control voltage terminal carried by said gate;

said third emitter extending towards and spaced from the junction of the first and second bases a distance less than that of the first emitter;

the first and second bases and the first emitter forming a three-layer structure having a second current transfer ratio which is less than the first current transfer ratio given a forward bias of the second emitter with respect to the first emitter because of the greater recombination rate of carriers of the first emitter due to its greater distance from the junction of the first and second bases.

2. The improved thyristor of claim 1, wherein: the first emitter is of an n-conductivity type.

3. The improved thyristor of claim 1, wherein: the first emitter is of a p-conductivity type.

4. The improved thyristor of claim 1, and further comprising:

a sub-region in the first base surrounding the first emitter and having a degree of doping which is higher than the degree of doping of the sub-region of the first base which surrounds the third emitter.

5. The improved thyristor of claim 1, and further comprising:

a first sub-region of the first base surrounding said third emitter;

a second sub-region of the first base surrounding the first emitter; and recombination centers in said first and second sub-regions, the number of recombination centers being greater per spatial unit in said second sub-region than in said first sub-region.

6. The improved thyristor of claim 1, wherein: said semiconductor body comprises recess means defining a recess in the first base adjacent the first emitter; and the third emitter comprises material surrounding the recess.

7. The improved thyristor of claim 1, and further comprising an electrode and wherein:

the first emitter comprises at least one controllable emitter sort circuit including a field effect transistor comprising:

a first region of the first conductivity type in the first emitter and connected to said electrode;

a second region of the first conductivity type spaced from said first region in the first emitter;

a third region, apart of the first emitter, between and connected to said first and second regions; and a gate insulated from the semiconductor body and bridging said first, second and third regions.

8. The improved thyristor of claim 1, and further comprising:

an ignition electrode on the first base spaced from said third emitter; and a terminal connected to said ignition electrode for connection to at least one control voltage.

9. The improved thyristor of claim 1, and further comprising:

an anode carried on the second emitter; and at least one cathode carried on the first emitter.

10. In a thyristor of the type having a semiconductor body in which a first base of a first conductivity type has a first emitter of a second conductivity type on one side thereof and a second base of the second conductivity type on the other side thereof, and in which a second emitter of the first conductivity type is provided adjacent the second base on the side opposite the first base, the improvement therein comprising:

a third emitter of the second conductivity type adjacent and spaced from the first emitter;

a semiconductor switch bridging and operable to conductively connect said third and first emitters;

said semiconductor switch comprising an external field effect transistor including a source, a drain and a gate, said source and drain connected between said third and first emitters and said gate adapted to receive a control voltage;

said third emitter and first and second bases forming a three-layer structure having a first current transfer ratio;

said third emitter extending towards and spaced from the junction of the first and second bases a distance less than that of the first emitter; and the first and second bases and the first emitter forming a three-layer structure having a second current transfer ratio which is less than the first current transfer ratio given a forward bias of the second emitter with respect to the first emitter because of the greater recombination rate of carriers of the first emitter due to its greater distance from the junction of the first and second bases.

11. The improved thyristor of claim 10, wherein: the first emitter is of an n-conductivity type.

12. The improved thyristor of claim 10, wherein: the first emitter is of a p-conductivity type.

13. The improved thyristor of claim 10, and further comprising:

a sub-region in the first base surrounding the first emitter and having a degree of doping which is higher than the degree of doping of the sub-region of the first base which surrounds the third emitter.

14. The improved thyristor of claim 10, and further comprising:

a first sub-region of the first base surrounding said third emitter;

a second sub-region of the first base surrounding the first emitter; and recombination centers in said first and second sub-regions, the number of recombination centers being greater per spatial unit in said second sub-region than in said first sub-region.

15. The improved thyristor of claim 10, wherein: said semiconductor body comprises recess means defining a recess in the first base adjacent the first emitter; and the third emitter comprises material surrounding the recess.

16. The improved thyristor of claim 10, and further comprising an electrode and wherein:

the first emitter comprises at least one controllable emitter short circuit including a field effect transistor comprising:

a first region of the first conductivity type in the first emitter and connected to said electrode;

a second region of the first conductivity type spaced from said first region in the first emitter;

a third region, apart of the first emitter, between and connected to said first and second regions; and a gate insulated from the semiconductor body and bridging said first, second and third regions.

17. The improved thyristor of claim 10, and further comprising:

an ignition electrode on the first base spaced from said third emitter; and a terminal connected to said ignition electrode for connection to at least one control voltage.

18. The improved thyristor of claim 10, and further comprising:

an anode carried on the second emitter; and at least one cathode carried on the first emitter.

* * * * *